US012431771B2

(12) United States Patent
Klenk et al.

(10) Patent No.: US 12,431,771 B2
(45) Date of Patent: Sep. 30, 2025

(54) POWER PACK FLEXIBLE ELECTRICAL CONNECTOR LOCATION

(71) Applicant: Steering Solutions IP Holding Corporation, Saginaw, MI (US)

(72) Inventors: Daniel J. Klenk, Saginaw, MI (US); Ryan D. Yaklin, Chesaning, MI (US); Kelly D. Haggart, Birch Run, MI (US); Troy A. Daenzer, Reese, MI (US); Todd F. Jammer, Birch Run, MI (US); Pierre C. Longuemare, Paris (FR); Kun Yang, Jiangsu (CN)

(73) Assignee: Steering Solutions IP Holding Corporation, Saginaw, MI (US)

( * ) Notice: Subject to any disclaimer, the term of this patent is extended or adjusted under 35 U.S.C. 154(b) by 1084 days.

(21) Appl. No.: 17/210,963

(22) Filed: Mar. 24, 2021

(65) Prior Publication Data
US 2021/0300458 A1  Sep. 30, 2021

Related U.S. Application Data

(60) Provisional application No. 63/002,872, filed on Mar. 31, 2020.

(51) Int. Cl.
*H02K 5/22* (2006.01)
*B62D 5/04* (2006.01)
(Continued)

(52) U.S. Cl.
CPC ............ *H02K 11/33* (2016.01); *B62D 5/0406* (2013.01); *B62D 5/046* (2013.01); *H02K 5/225* (2013.01); *H05K 7/14322* (2022.08)

(58) Field of Classification Search
CPC ........ H02K 5/225; H02K 11/30; H02K 11/33; H02K 2213/09; H02K 2213/12;
(Continued)

(56) References Cited

U.S. PATENT DOCUMENTS

2013/0300264 A1\* 11/2013 Fujimoto ............. B62D 5/0406
310/68 D
2013/0313929 A1\* 11/2013 Naka ........................ H02K 5/18
310/64

(Continued)

FOREIGN PATENT DOCUMENTS

| CN | 103921837 A | 7/2014 |
| CN | 109983673 A | 7/2019 |

(Continued)

OTHER PUBLICATIONS

English translation of First Office Action regarding corresponding DE App. No. 10 2021 107 960.8; dated Nov. 15, 2022.
(Continued)

*Primary Examiner* — Eric Johnson
(74) *Attorney, Agent, or Firm* — Dickinson Wright PLLC

(57) ABSTRACT

A power pack assembly includes a housing extending axially about a longitudinal axis. The power pack assembly also includes a circuit board having a board main portion covered by the housing and having a first board extended segment extending radially away from the longitudinal axis and out of the housing and uncovered by the housing. The power pack assembly further includes at least one logic connector disposed on the first board extended segment of the circuit board.

11 Claims, 9 Drawing Sheets

(51) Int. Cl.
*H02K 11/33* (2016.01)
*H05K 7/14* (2006.01)

(58) Field of Classification Search
CPC .... B62D 5/0406; B62D 5/046; H05K 7/1432; H05K 7/14322
See application file for complete search history.

(56) References Cited

U.S. PATENT DOCUMENTS

2016/0347354 A1\* 12/2016 Asao ................. H02K 3/28
2019/0126972 A1\* 5/2019 Okamura ............ H05K 5/0047
2020/0195098 A1\* 6/2020 Shimakawa .......... H02K 9/227
2020/0220435 A1 7/2020 Hattori et al.
2023/0011559 A1\* 1/2023 Yamada .............. H02K 9/223

FOREIGN PATENT DOCUMENTS

| CN | 110654452 A | 1/2020 | |
|----|----|----|----|
| DE | 102011002006 A1 | 5/2012 | |
| DE | 112018005481 T5 | 10/2020 | |
| EP | 2824014 A1 | 1/2015 | |
| JP | 2002345211 A | 11/2002 | |
| WO | 2012137322 A1 | 7/2014 | |
| WO | WO-2018221726 A1 \* | 12/2018 | ........... B62D 5/0406 |
| WO | 2019064765 A1 | 4/2019 | |

OTHER PUBLICATIONS

First Office Action and Search Report regarding corresponding CN App. No. 202110338783.4; dated Mar. 31, 2023.

\* cited by examiner

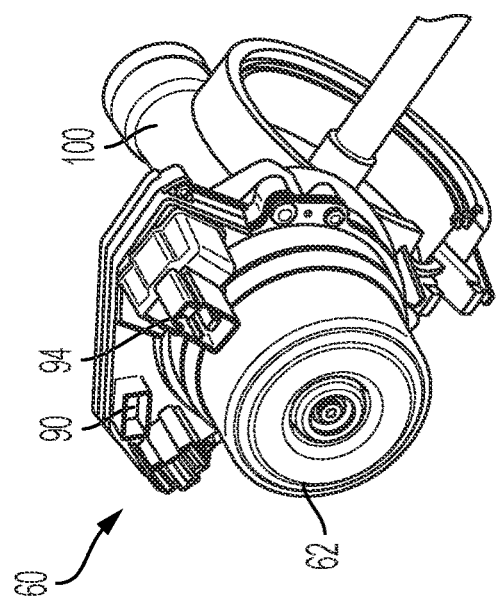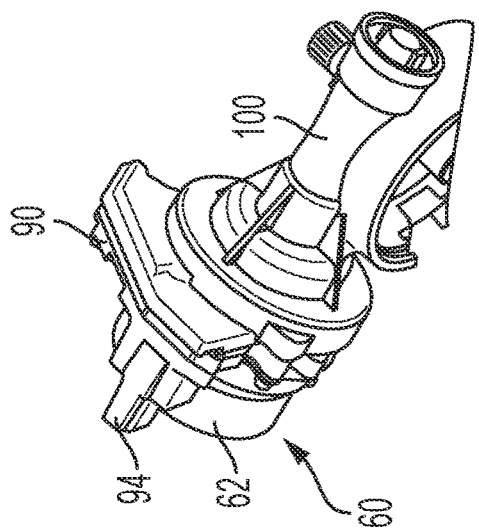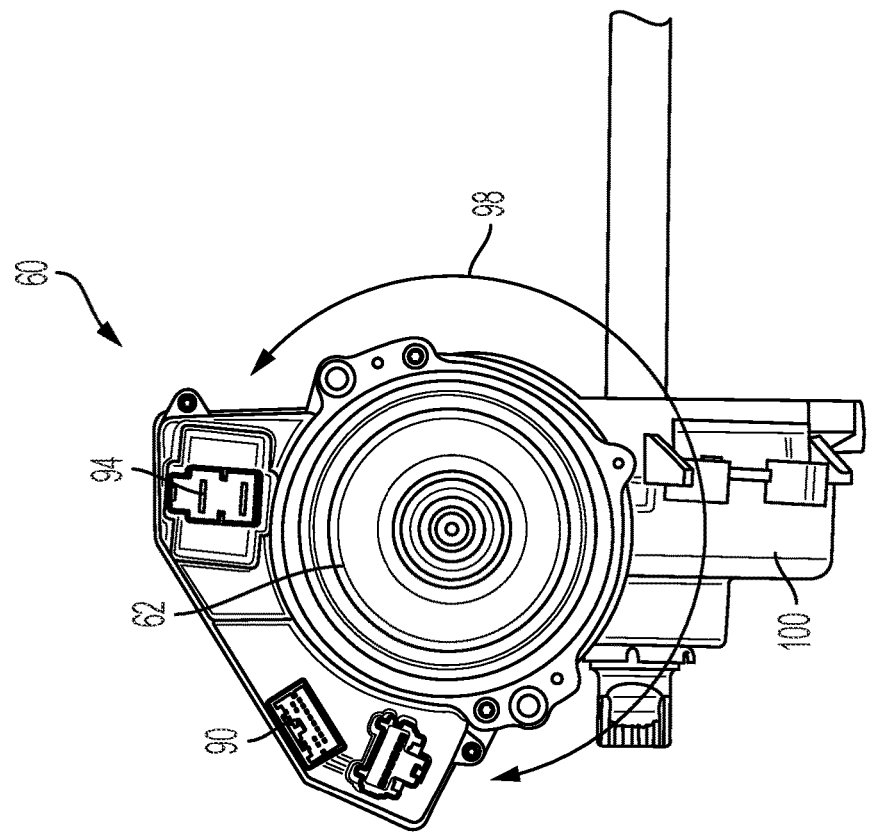

POWER PACK FLEXIBLE ELECTRICAL CONNECTOR LOCATION

CROSS-REFERENCE TO RELATED APPLICATION

This patent application claims the benefit of priority to U.S. Provisional Patent Application Ser. No. 63/002,872, filed Mar. 31, 2020, the entire disclosure of which is incorporated by reference herein in its entirety.

FIELD OF THE INVENTION

The present disclosure relates to vehicle steering power pack assemblies and, more specifically, to such assemblies having flexible electrical connector locations.

BACKGROUND

A vehicle often includes an electric power steering (EPS) system to aid an operator of the vehicle in steering the vehicle. The EPS system uses sensors to detect a position and torque of a steering column and supply a signal to an electric motor to cause the electric motor to supply additional torque to assist the operator in steering the vehicle. The additional torque supplied to assist the operator in steering the vehicle can vary based on vehicle characteristics, driving conditions, road conditions, and the like.

The EPS system can utilize a controller to receive signals from sensors, analyze the signals, and control the electric motor. The controller board is connected to a motor housing via a tray, which may be referred to herein as a connector plate. Together, these components maybe referred to as a power pack assembly that provides electrical power for one or more functions associated with the steering system. Power pack assemblies often include a circuit card or printed circuit board (PCB) with electrical connectors in electrical communication therewith. Typically, the architecture of the PCB and electrical connectors only allow a single orientation—and therefore location—of the connectors, and therefore does not provide design layout flexibility.

SUMMARY OF THE DISCLOSURE

According to one aspect of the disclosure, a power pack assembly includes a housing extending axially about a longitudinal axis. The power pack assembly also includes a circuit board having a board main portion covered by the housing and having a first board extended segment extending radially away from the longitudinal axis and out of the housing and uncovered by the housing. The power pack assembly further includes at least one logic connector disposed on the first board extended segment of the circuit board.

According to another aspect of the disclosure, an electric power steering (EPS) system includes an EPS housing. The EPS system also includes a power pack assembly. The power pack assembly includes a housing having a main body extending axially from a plurality of flange portions to an end surface about a longitudinal axis, the housing operatively coupled to the EPS housing with at least one mechanical fastener extending through at least one of the flange portions. The power pack assembly also includes a circuit board having a board main portion, a first board extended segment and a second board extended segment, the board main portion covered by the housing, the first board extended segment extending radially away from the longitudinal axis and out of the housing and uncovered by the housing, and the second board extended segment extending radially away from the longitudinal axis and out of the housing and uncovered by the housing. The power pack assembly further includes at least one logic connector disposed on the first board extended segment of the circuit board. The power pack assembly yet further includes at least one power connector disposed on the second board extended segment of the circuit board.

These and other advantages and features will become more apparent from the following description taken in conjunction with the drawings.

BRIEF DESCRIPTION OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 15-17 illustrate an example configuration of the power pack assembly with an internal connector;

DETAILED DESCRIPTION

Referring to the Figures, without limiting same, embodiments of the disclosure are described herein. In particular, a manual power pack assembly for an electric power steering (EPS) system are disclosed herein. Although illustrated and described in connection with a column EPS system, it is to be appreciated that other types of EPS systems (e.g., rack) may benefit from the embodiments disclosed herein. Furthermore, the illustrated steering system has a mechanical connection from the steering input device to the steering gear, but it is to be appreciated that steer-by-wire systems may also benefit from the disclosed embodiments. Therefore, the illustrated embodiment is not limiting of the particular application that the manual power pack assembly may be utilized with.

Figure 1:
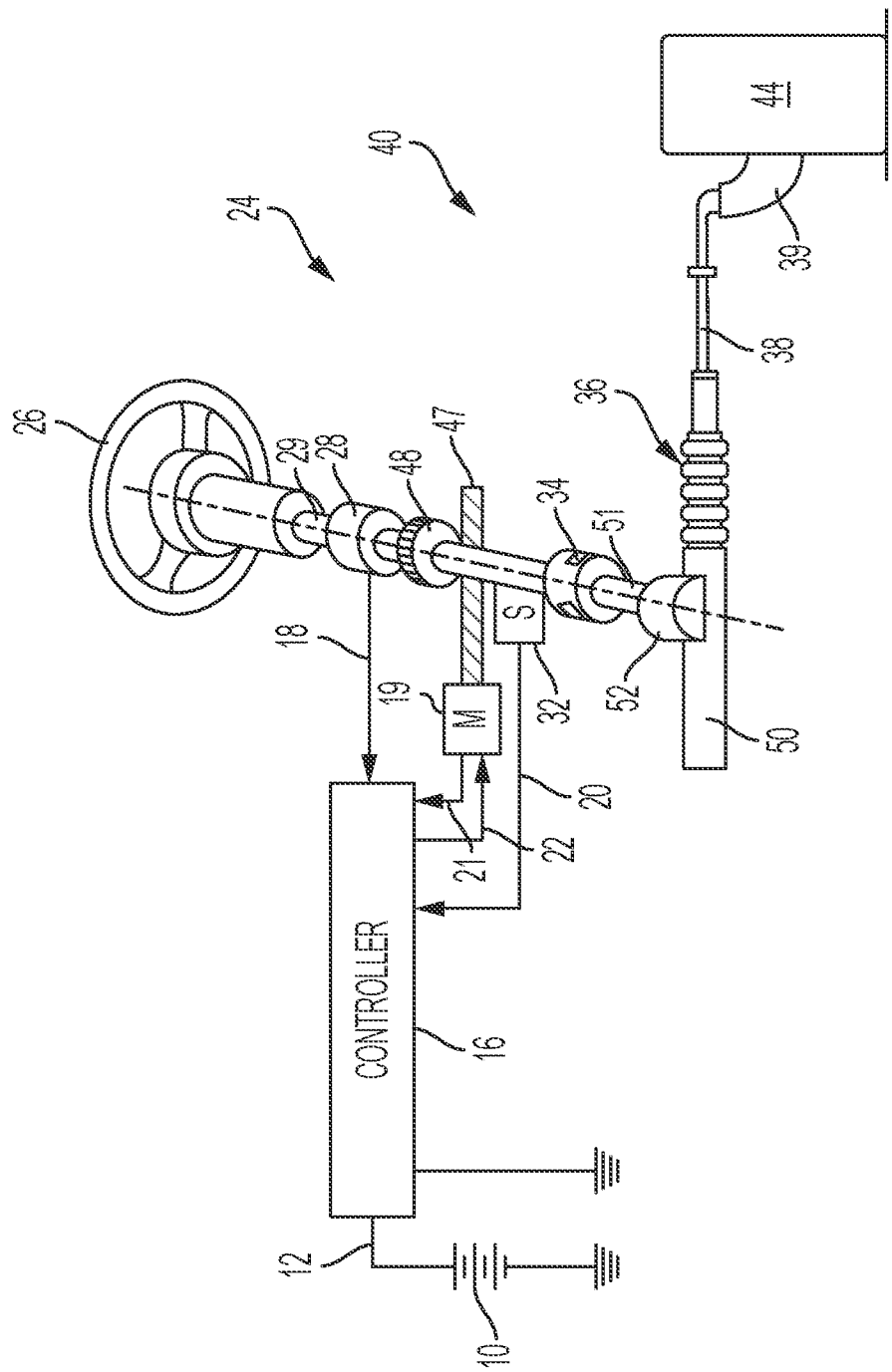
FIG. 1 schematically illustrates an electric power steering (EPS) system for a vehicle.
Figure 3:
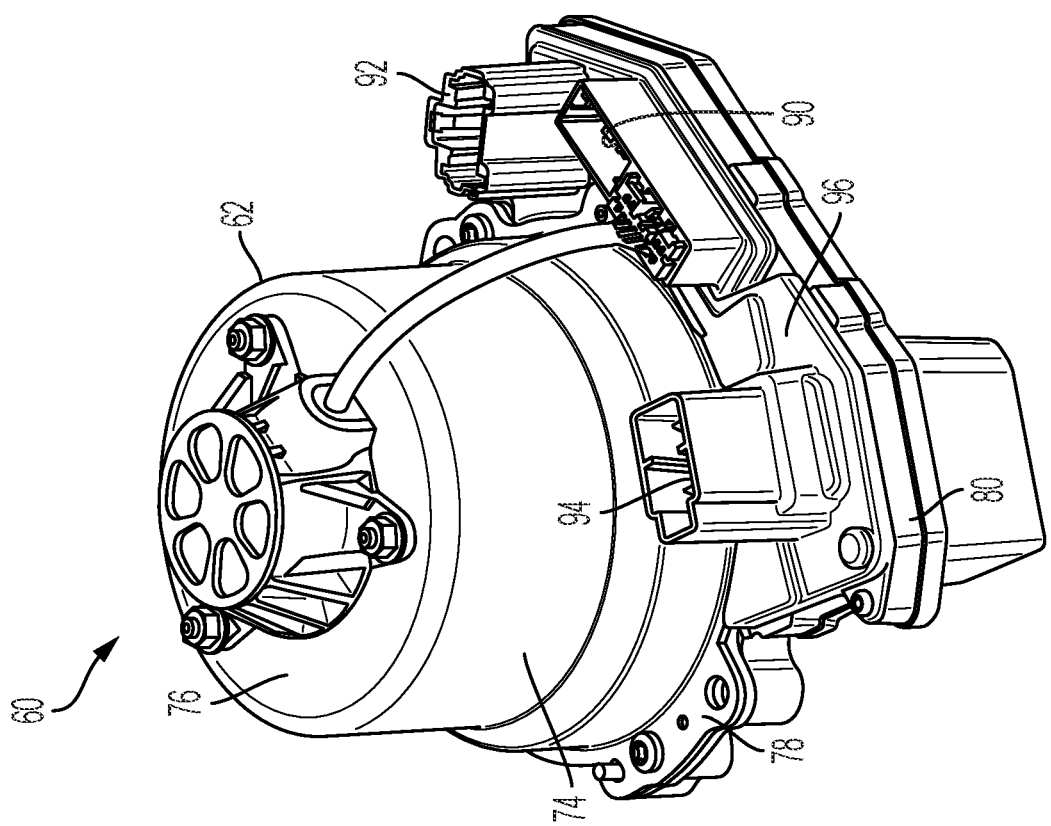
FIG. 3 is a top perspective view of the power pack assembly.
Figure 2:
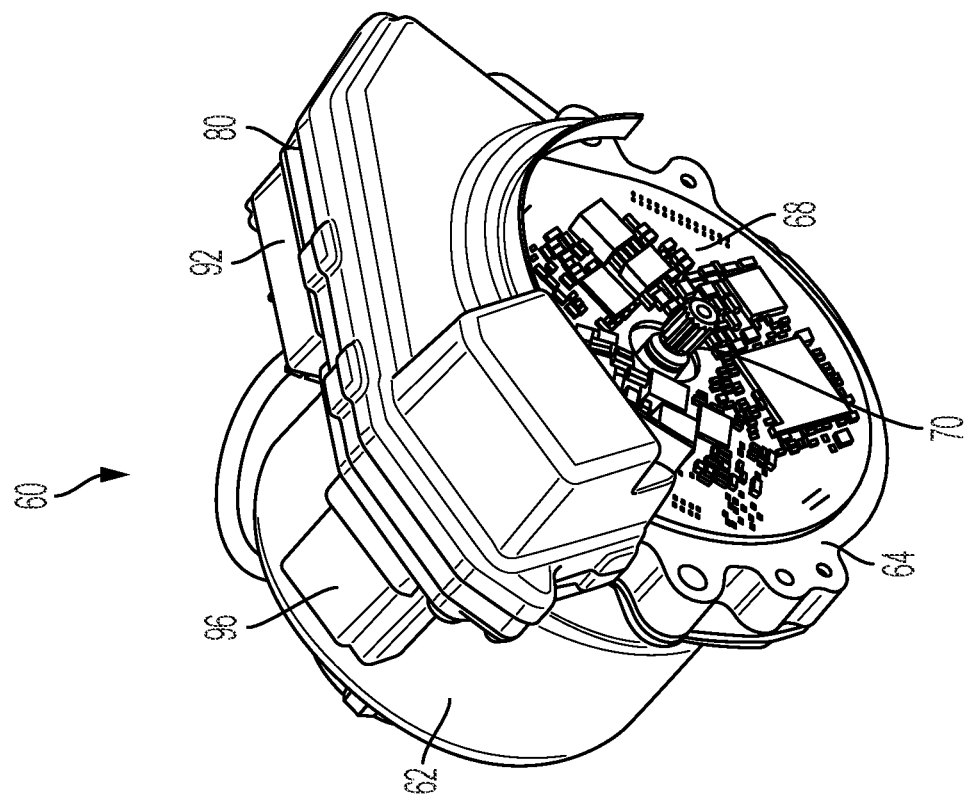
FIG. 2 is a bottom perspective view of a power pack assembly.
Figure 5:
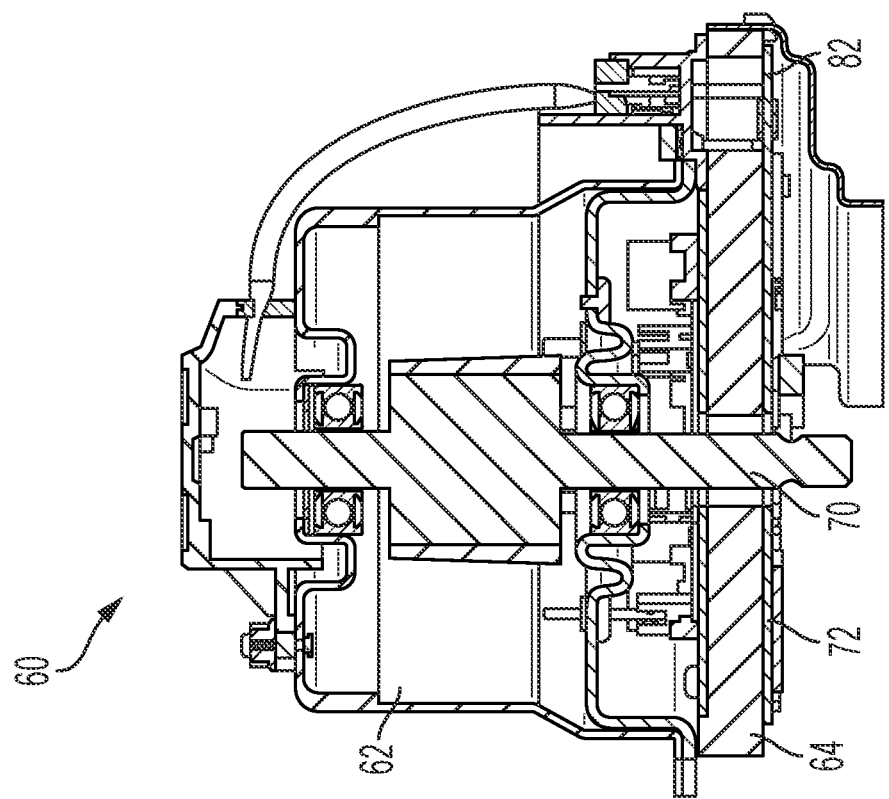
FIG. 5 is a cross-sectional view of the power pack assembly.
Figure 4:
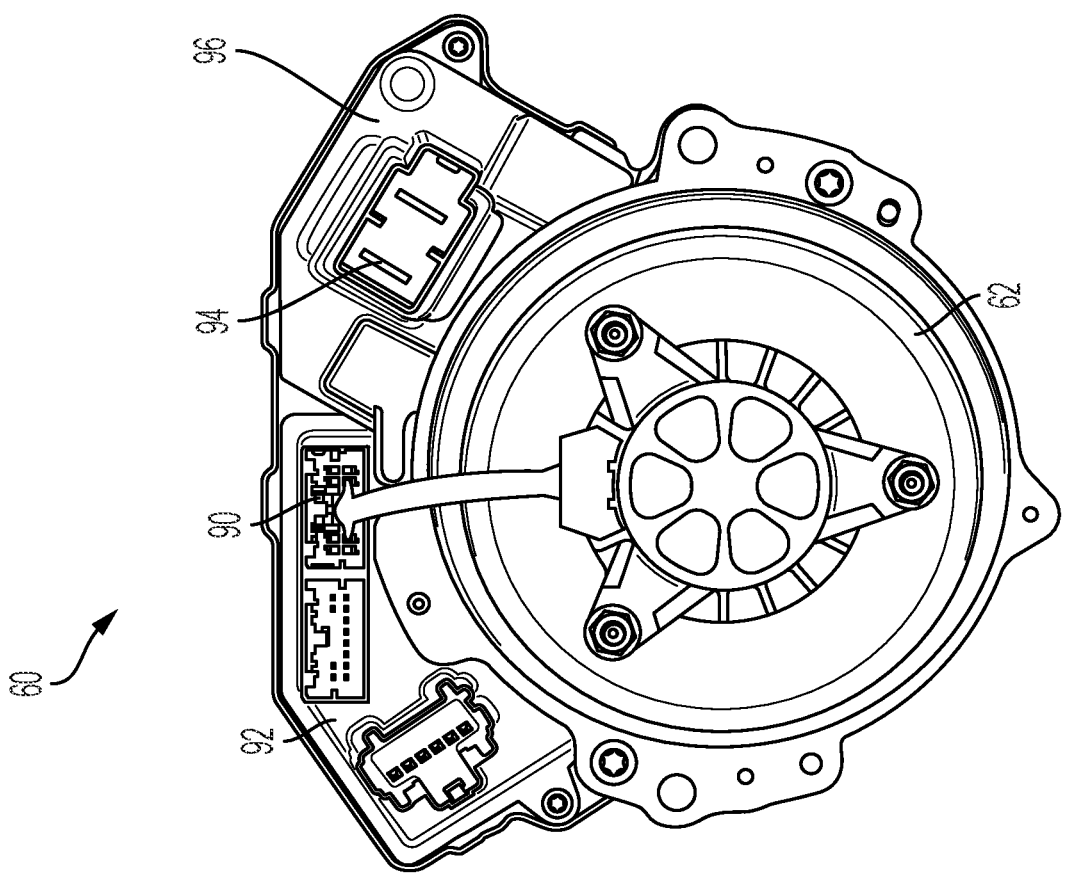
FIG. 4 is an end view of a power pack assembly.
Figure 8:
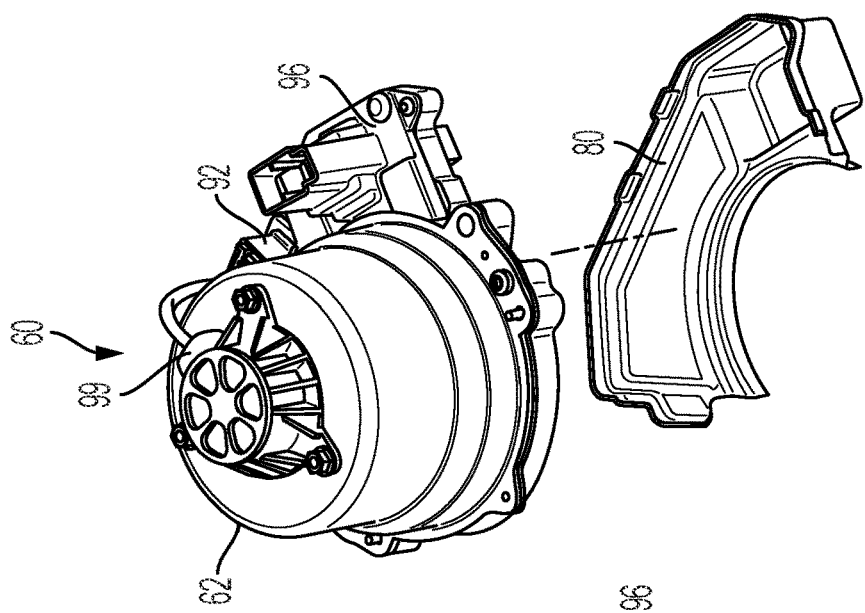
FIG. 8 is another partially disassembled view of the power pack assembly.
Figure 7:
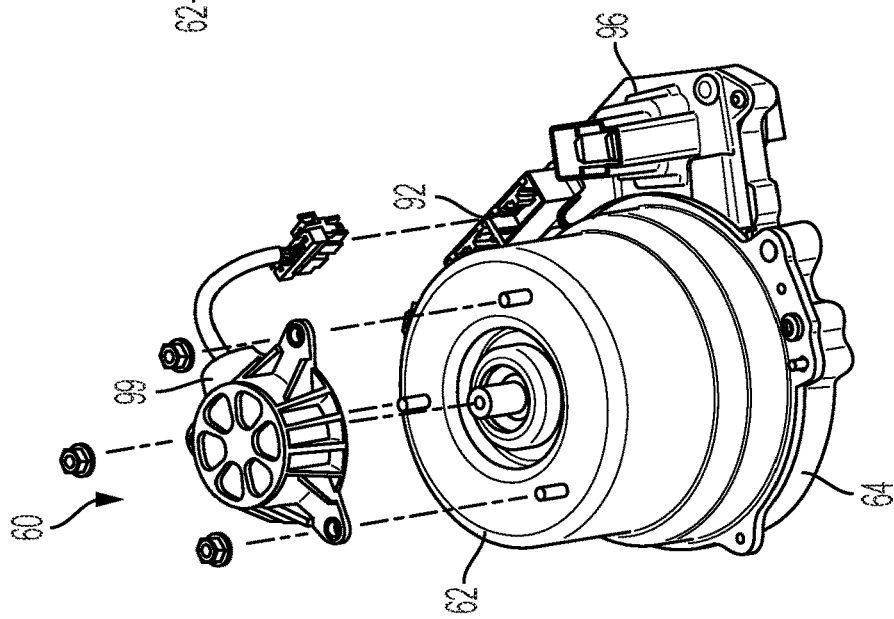
FIG. 7 is another partially disassembled view of the power pack assembly.
Figure 6:
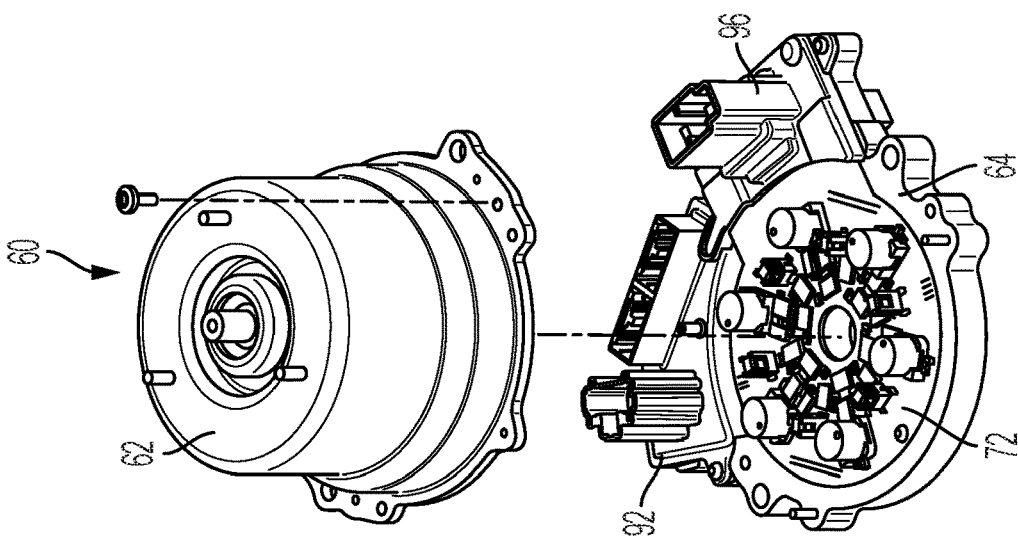
FIG. 6 is a partially disassembled view of the power pack assembly.

FIG. 1 is an exemplary embodiment of an electric power steering system (EPS) 40 suitable for implementation of the disclosed embodiments. The steering mechanism 36 is a rack-and-pinion type system and includes a toothed rack (not shown) within housing 50 and a pinion gear (also not shown) located under gear housing 52. As the operator input, hereinafter denoted as a steering wheel 26 (e.g. a hand wheel or the like) is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown), in turn moving the steering knuckles 39 (only one shown), which turn steerable wheel(s) 44 (only one shown).

Electric power steering assist is provided through the control apparatus generally designated by reference numeral 24 and includes the controller 16 and an electric machine 19, which could be a permanent magnet synchronous motor, a permanent magnet direct current motor, a switched reluctance motor, or any other type of motor, are is hereinafter denoted as motor 19. The controller 16 is powered by the vehicle power supply 10 through line 12. The controller 16 receives information from sensors relating to various operating conditions and/or inputs of the EPS system 40, examples of which are illustrated and described below.

As the steering wheel 26 is turned, a torque sensor 28 senses the torque applied to the steering wheel 26 by the vehicle operator. The torque sensor 28 may include a torsion bar (not shown) and a variable resistive-type sensor (also not shown), which outputs a variable torque signal 18 to the controller 16 in relation to the amount of twist on the torsion bar. Although this is one type of torque sensor, any other suitable torque-sensing device used with known signal processing techniques will suffice. In response to the various inputs, the controller sends a command 22 to the electric motor 19, which supplies torque assist to the steering system through worm 47 and worm gear 48, providing torque assist to the vehicle steering. A feedback signal 21 is returned to the controller 16 from the electric motor 19.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and the like, to compute a command(s) to deliver the required output power. Controller 16 is disposed in communication with the various systems and sensors of the motor control system. Controller 16 receives signals from each of the system sensors, quantifies the received information, and provides an output command signal(s) in response thereto, in this instance, for example, to the motor 19. Controller 16 is configured to develop the necessary voltage(s) out of inverter (not shown), which may optionally be incorporated with controller 16 and will be referred to herein as controller 16, such that, when applied to the motor 19, the desired torque or position is generated. Because these voltages are related to the position and speed of the motor 19 and the desired torque, the position and/or speed of the rotor and the torque applied by an operator are determined. A position encoder is connected to the steering shaft 51 to detect the angular position. The encoder may sense the rotary position based on optical detection, magnetic field variations, or other methodologies. Typical position sensors include potentiometers, resolvers, synchros, encoders, and the like, as well as combinations comprising at least one of the forgoing. The position encoder outputs a position signal 20 indicating the angular position of the steering shaft 51 and thereby that of the motor 19.

As shown in FIGS. 2-8, a power pack assembly is shown and generally referenced with numeral 60. As described above, the power pack assembly 60 is an assembly that provides power to one or more systems of a vehicle steering system. Although illustrated and described largely as being used to power the EPS system 40, it is to be appreciated that the power pack assembly 60 may be used to power other electric systems.

The power pack assembly includes a housing 62 that mounts to a heat sink tray 64 to enclose a portion of a controller circuit card 68 and motor shaft 70 that drives the EPS system 40. The controller circuit card 68 has a main portion 72 (FIGS. 5 and 6) that is covered by the housing 62. As shown, the housing 62 has a body portion 74, an end surface 76, and a plurality of flange portions 78 located on an opposite end of the body portion 74 relative to the end surface 76. The body portion 74 comprises at least one substantially cylindrical portion, but may include one or more steps, as shown in the illustrated embodiment.

The flange portions 78 each include one or more apertures to receive mechanical fasteners for coupling the housing 62 to the heat sink tray 64 and/or to receive position locating pins or the like. The perimeter of the body portion 74 and the flange portions 78 cover the main portion 72 of the controller circuit card 68 when the housing 62 is coupled to the heat sink tray 64. However, the heat sink tray 64 and the controller circuit card 68 each include substantially corresponding segments that extend radially outwardly to positions outside of the housing 62. In other words, the heat sink tray 64 includes one or more tray extended segments 80 and the controller circuit card 68 includes one or more card extended segments 82 that each extend sufficiently to not be covered by the housing 62. These extended segments 80, 82 (FIG. 5) are therefore external to the housing 62.

The extended segments 80, 82 provide additional connection points that may be oriented based on the specifications of the overall system. Therefore, the overall power pack assembly 60 is adjustable to accommodate various orientations that would be beneficial to the system. This is in contrast to power pack assemblies that cover all of the connection points within the housing. In the illustrated embodiments, first connection points are generally referenced with numeral 90 and partially covered with a first connector shroud 92. The first connection points 90 are logic connectors that form a logic header. A second connection point 94 is a power source connection and is partially covered with a second connector shroud 96. The second connection point 94 is a power connector that is a power header.

Figure 10:
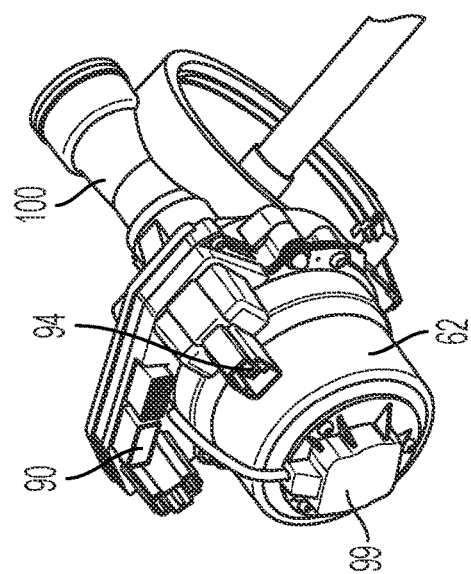
FIGS. 9-11 illustrate an example configuration of the power pack assembly with an external connector.
Figure 11:
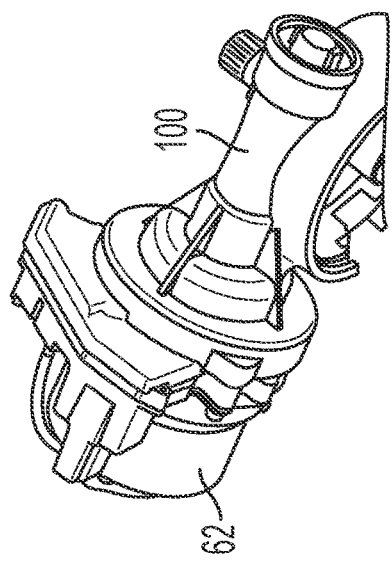
Figure 9:
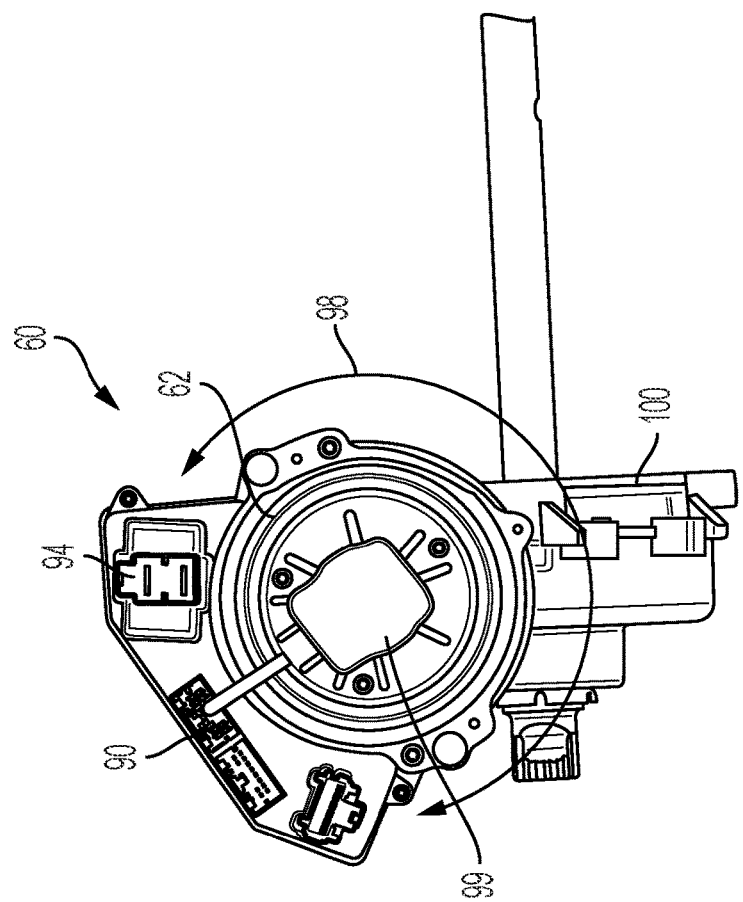

FIGS. 9-11 illustrate the power pack assembly 60 coupled to an EPS system housing 100 according to a first orientation with an external main switchboard (MSB) 99. In the illustrated embodiment, the connection points 90, 94 are directed toward the housing 62. Arrows 98 represent the rotational capability of the power pack assembly 60. In other words, the angular position of the power pack assembly 60 may be changed to suit the most desirable system orientation required by the overall system.

Figure 13:
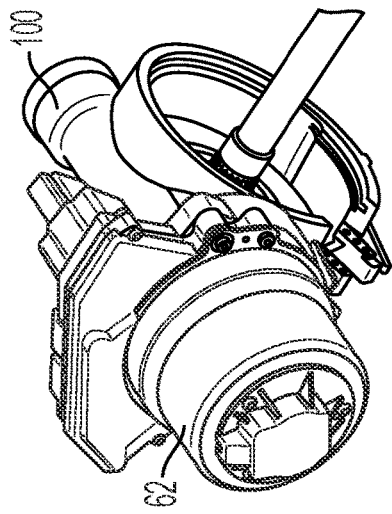
FIGS. 12-14 illustrate another example configuration of the power pack assembly with an external connector.
Figure 14:
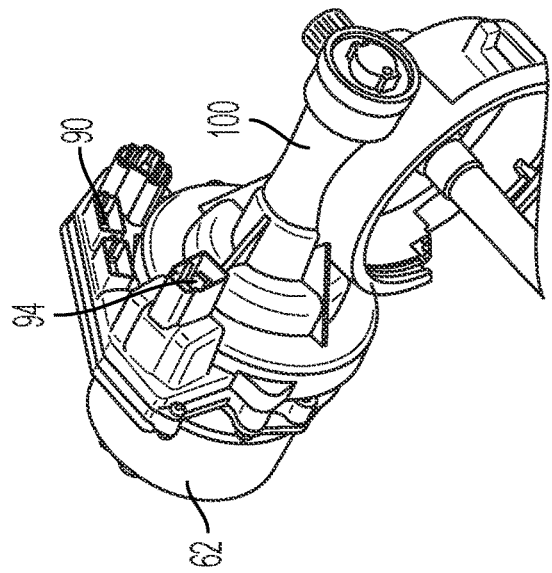
Figure 12:
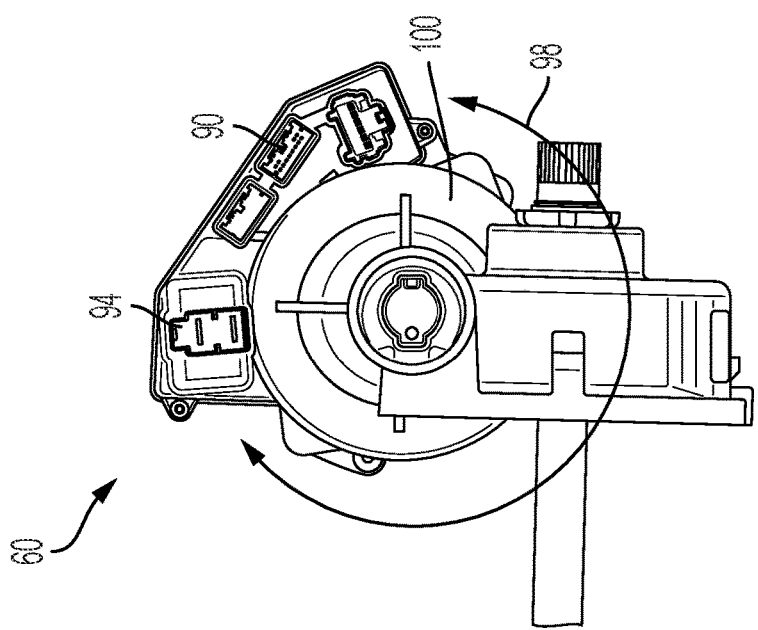

FIGS. 12-14 illustrate the power pack assembly 60 coupled to the EPS system housing 100 according to another orientation with the external MSB 99. In the illustrated embodiment, the connection points 90, 94 are directed away the housing 62. This represents what may be referred to as a "mirrored" orientation, relative to the embodiment shown in FIGS. 9-11. Arrows 98 represent the rotational capability of the power pack assembly 60. In other words, the angular position of the power pack assembly 60 may be changed to suit the most desirable system orientation required by the overall system.

FIGS. 15-18 illustrate the power pack assembly 60 coupled to an EPS system housing 100 according to a first orientation with an internal MSB. In the illustrated embodiment, the connection points 90, 94 are directed toward the housing 62. Arrows 98 represent the rotational capability of the power pack assembly 60. In other words, the angular position of the power pack assembly 60 may be changed to suit the most desirable system orientation required by the overall system.

Figure 19:
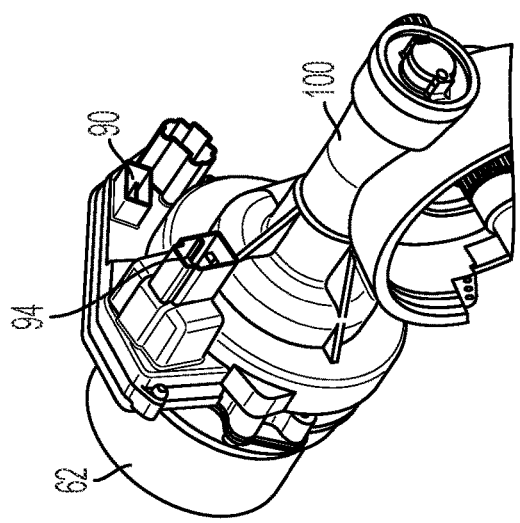
FIGS. 18-20 illustrate another example configuration of the power pack assembly with an internal connector.
Figure 20:
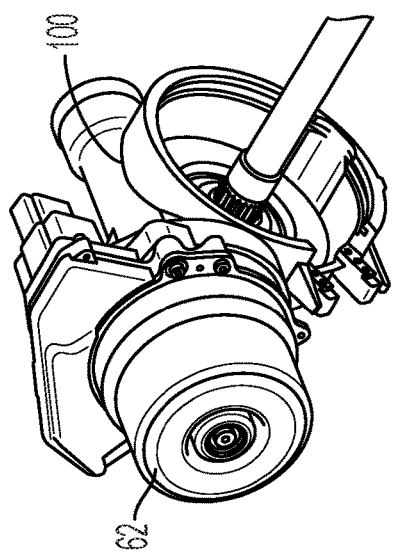
Figure 18:
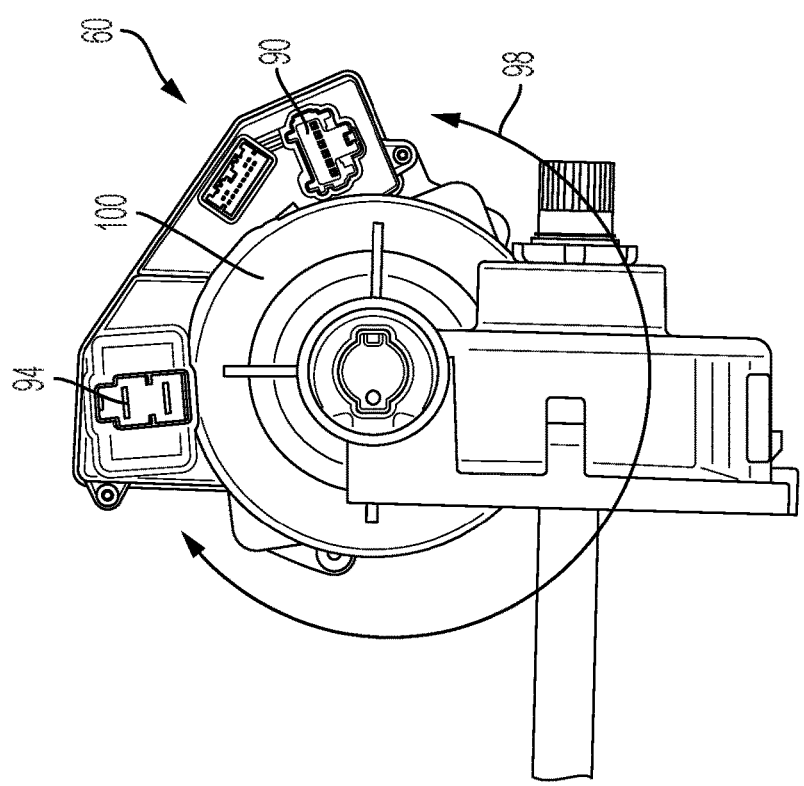

FIGS. 18-20 illustrate the power pack assembly 60 coupled to the EPS system housing 100 according to another orientation with the internal MSB. In the illustrated embodiment, the connection points 90, 94 are directed away the housing 62. This represents what may be referred to as a "mirrored" orientation, relative to the embodiment shown in FIGS. 15-18. Arrows 98 represent the rotational capability of the power pack assembly 60. In other words, the angular position of the power pack assembly 60 may be changed to suit the most desirable system orientation required by the overall system.

Figure 21:
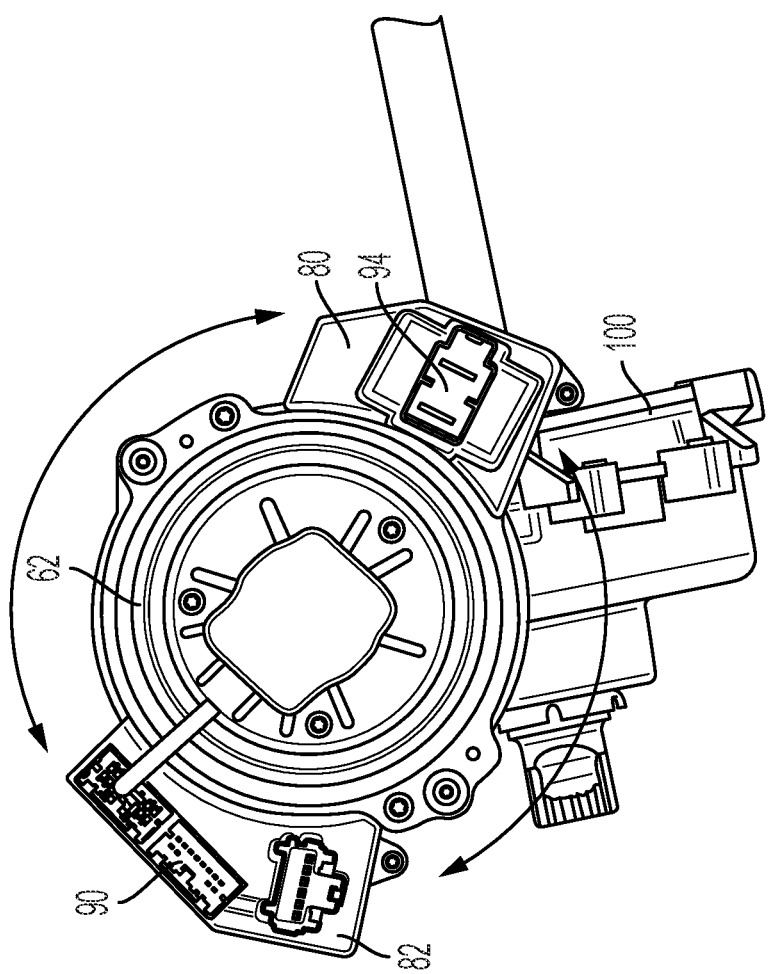
FIG. 21 illustrates the power pack assembly according to yet another example configuration.

Referring now to FIG. 21, the power pack assembly 60 is shown with the first and second connection points 90, 94 separated by circumferentially spacing the connection points 90, 94 on the extended segments. The degree of separation of the first and second connection points 90, 94 is customizable. In the illustrated embodiment, the connection points (i.e., headers) 90, 94 are separated by approximately 180 degrees, but it is to be understood that this is merely one example of the extent of separation that can be provided with these extended segments 80, 82 of the controller circuit card 68. For example, the connection points 90, 94 may be separated by over 45 degrees or over 90 degrees in example embodiments.

The power pack assembly also includes the power inductor disclosed herein for connection to a power source, such as a battery, while also facilitating compliant connection to the circuit card. Additionally, one or more electrical connectors are provided for electrical connection to various other components.

The embodiments disclosed herein maintain a common circuit card layout within the motor housing diameter. By doing so, common motor connection points on the extended board sections can be reconfigured to accept different customer needs for the vehicle harness interface. In addition, the battery power connections are split from the logic or communication circuits, thereby allowing for increased variation possibilities.

The disclosed embodiments provide design flexibility to offer different connector access locations based on vehicle packaging and customer preferences. The ability to keep a common power pack layout, while offering connector location is an improvement over previous power pack designs. The use of the printed circuit card with adjustable board configurations allows for a low cost interconnect to the controller.

By placing the main component structure within the substantially round diameter of the motor housing 62, the ability to populate and depopulate circuits without impacting the primary motor interface is achieved, while still having the flexibility to offer different connection locations and not impact the main structure of the controller and power pack.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A power pack assembly comprising:
    a housing extending axially about a longitudinal axis;
    a circuit board having a board main portion covered by the housing and having a first board extended segment extending radially away from the longitudinal axis and out of the housing and uncovered by the housing;
    a heat sink tray operatively coupled to the housing to enclose the board main portion of the circuit board, wherein the heat sink tray is a component separate and distinct from the housing, and
    at least one logic connector disposed on the first board extended segment of the circuit board, wherein the at least one logic connector is directed away from the housing, wherein the circuit board further comprises an adjustable second board extended segment extending radially away from the longitudinal axis and out of the housing and uncovered by the housing, the second board extended segment having a power connector disposed thereon, wherein the logic connector and the power connector are adjustable relative to each other in a circumferential, rotational direction to define a range of relative positioning between the logic connector and the power connector, wherein the range of relative positioning includes 180 degrees of angular separation between the logic connector and the power connector.

2. The power pack assembly of claim 1, wherein the heat sink tray comprises a tray main portion and a first tray extended segment, the tray main portion corresponding to the board main portion and the first tray extended segment corresponding to the first board extended segment.

3. The power pack assembly of claim 1, wherein the housing has a cylindrical body.

4. The power pack assembly of claim 1, wherein the first board extended segment and the second board extended segment are located circumferentially adjacent to each other.

5. The power pack assembly of claim 1, wherein the first board extended segment and the second board extended segment are circumferentially spaced from each other.

6. An electric power steering (EPS) system comprising:
    an EPS housing; and
    a power pack assembly comprising:
        a housing having a main body extending axially from a plurality of flange portions to an end surface about a longitudinal axis, the housing operatively coupled to the EPS housing with at least one mechanical fastener extending through at least one of the flange portions;
        a circuit board having a board main portion, a first board extended segment and a second board extended segment, the board main portion covered by the housing, the first board extended segment extending radially away from the longitudinal axis and out of the housing and uncovered by the housing, and the second board extended segment extending radially away from the longitudinal axis and out of the housing and uncovered by the housing;

at least one logic connector disposed on the first board extended segment of the circuit board; and at least one power connector disposed on the second board extended segment of the circuit board, wherein the at least one logic connector and the at least one power connector are directed away from the housing, wherein the logic connector and the power connector are adjustable relative to each other in a circumferential, rotational direction to define a range of relative positioning between the logic connector and the power connector, wherein the range of relative positioning includes 180 degrees of angular separation between the logic connector and the power connector.

7. The EPS system of claim 6, the power pack assembly further comprising a heat sink tray operatively coupled to the housing to enclose the board main portion of the circuit board.

8. The EPS system of claim 7, wherein the heat sink tray comprises a tray main portion, a first tray extended segment and a second tray extended segment, the tray main portion corresponding to the board main portion, the first tray extended segment corresponding to the first board extended segment, and the second tray extended segment corresponding to the second board extended segment.

9. The EPS system of claim 6, wherein the housing has a cylindrical body.

10. The EPS system of claim 6, wherein the first board extended segment and the second board extended segment are located circumferentially adjacent to each other.

11. The EPS system of claim 6, wherein the first board extended segment and the second board extended segment are circumferentially spaced from each other.

* * * * *